(12) United States Patent
Moorehead, Jr. et al.

(10) Patent No.: US 8,107,257 B2
(45) Date of Patent: Jan. 31, 2012

(54) ELECTRONIC ASSEMBLY RETAINING SYSTEM

(75) Inventors: Joseph W. Moorehead, Jr., Galena, OH (US); James A. Krist, Sunbury, OH (US)

(73) Assignee: L-3 Communications Avionics Systems, Inc., Grand Rapids, MI (US)

( * ) Notice: Subject to any disclaimer, the term of this patent is extended or adjusted under 35 U.S.C. 154(b) by 386 days.

(21) Appl. No.: 12/435,117

(22) Filed: May 4, 2009

(65) Prior Publication Data
US 2010/0277875 A1    Nov. 4, 2010

(51) Int. Cl.
*H05K 7/14* (2006.01)
*H05K 7/18* (2006.01)

(52) U.S. Cl. .......................... 361/801; 361/807; 361/810

(58) Field of Classification Search .......... 361/801–803, 361/807, 810, 730, 752, 796, 800; 312/22.1, 312/223.2
See application file for complete search history.

(56) References Cited

U.S. PATENT DOCUMENTS

| | | | |
|---|---|---|---|
| 933,998 A | 9/1909 | Linton | |
| 1,309,421 A | 7/1919 | Shults | |
| 1,442,118 A | 1/1923 | Bowers | |
| 1,627,404 A | 5/1927 | Outhier | |
| 2,073,612 A | 3/1937 | Favatt | |
| 2,616,475 A | 11/1952 | Koza | |
| 3,255,796 A | 6/1966 | Tobey | |
| 3,872,734 A * | 3/1975 | Riethmeier | 74/89.45 |
| 4,497,528 A | 2/1985 | Murtland | |
| 4,506,439 A | 3/1985 | Roake | |
| 4,845,591 A | 7/1989 | Pavie | |
| 4,882,655 A | 11/1989 | Pavie | |
| 5,190,241 A | 3/1993 | Pease | |
| 5,458,432 A | 10/1995 | Teschner, III et al. | |
| 5,460,468 A | 10/1995 | DiStacio | |
| 5,746,458 A | 5/1998 | Fisher | |
| RE35,937 E | 10/1998 | DiStasio | |
| 6,797,879 B2 * | 9/2004 | Leyda et al. | 174/50 |
| 6,954,940 B2 * | 10/2005 | Hsu | 720/639 |
| 7,400,936 B2 * | 7/2008 | Chang | 700/90 |
| 7,508,660 B2 * | 3/2009 | Lin | 361/679.33 |
| 7,646,613 B2 * | 1/2010 | Ligtenberg et al. | 361/801 |
| 2005/0157463 A1 * | 7/2005 | Hsu | 361/685 |

* cited by examiner

*Primary Examiner* — Hung S Bui
(74) *Attorney, Agent, or Firm* — Gardner, Linn, Burkhart & Flory, LLP (57) ABSTRACT

An electronic assembly retaining system provides a secure mount for an electronic assembly, such as an avionics assembly, while being lockable and releasable via manual rotation of a single retainer stem that may be positioned in a readily-accessible location. The retainer stem may include threaded shaft and a detent system to resist inadvertent rotation of the stem. The system includes a housing that at least partially encloses the electronic assembly and which includes a receiving element for receiving a distal end portion of the retainer stem, which is movable between engaging and disengaging positions.

26 Claims, 5 Drawing Sheets

ELECTRONIC ASSEMBLY RETAINING SYSTEM

FIELD OF THE INVENTION

The present invention relates generally to mounting assemblies, and more particularly, to mounting assemblies for releasably retaining electronics at a mounting surface. While an embodiment of the invention is illustrated for use with avionics electronic assemblies, it may be used for mounting electronic assemblies in other vehicles as well as non-vehicular applications.

BACKGROUND OF THE INVENTION

Replaceable electronic assemblies, such as Line Replaceable Units (LRU's) used in the avionics industry, are typically installed in such a manner as to be removable and replaceable in their operating environments. Such mounting systems may include multiple fasteners that are engaged by a tool in order to lock an LRU in position, and to release the LRU.

SUMMARY OF THE INVENTION

The present invention provides a system for releasably retaining an electronic assembly, in which the system securely holds the electronic assembly in a desired position. The retaining system may be readily engaged and disengaged without the use of tools, is lightweight, and provides an alignment function whereby small misalignments of the electronic assembly are corrected as the electronic assembly is locked in position.

According to one aspect of the invention, an electronic assembly retaining system includes a housing covering at least a portion of an electronic assembly, a front retainer assembly, and a rear retainer. The front retainer assembly includes a mounting member, a retainer stem, and a receiving element. The retainer stem is mounted to the mounting member and movable therealong, and the receiving element is at the front portion of the housing. The receiving element and retainer stem include cooperative surfaces that engage and disengage one another according to the position of the retainer stem. The retainer stem is movable between an engaging position in which the cooperative surfaces contact one another, and a disengaging position in which the cooperative surfaces disengage or are spaced from one another. The rear retainer engages the rear portion of the housing, which is retained by the front retainer assembly and the rear retainer when the retainer stem is moved to the engaging position. The housing is removable from the front retainer assembly when the retainer stem is moved to the disengaging position.

Optionally, the retaining system includes a tray having a bottom wall and a rear wall, with the rear wall extending away from a rear portion of the bottom wall. The mounting member and retainer stem are mounted at a front portion of the tray opposite the rear wall.

Optionally, the mounting member includes a threaded bore for receiving a threaded shaft of the retainer stem whereby rotation of the retainer stem causes it to translate along the threaded bore of the mounting member. A knob may be provided at an end of the retainer stem, opposite the peg portion, to permit manual rotation of the stem without the use of tools.

Optionally, the threaded shaft of the retainer stem includes a longitudinal groove that is contacted by a groove-engaging member at the mounting member. The groove-engaging member, which may be a ball or other element, is biased against the threaded shaft to provide a detent when the groove-engaging member is urged against or into the longitudinal groove.

Optionally, the receiving element of the electronic assembly housing includes an aperture and/or a countersink. The countersink provides an alignment feature, whereby contact of the retainer stem with the countersink of the receiving element will align the housing as the retainer stem is moved fully to the engaging position. The aperture provides an extra locking feature, whereby insertion of a tip portion of the retainer stem into the aperture of the receiving element securely holds the housing in position.

Thus, the retaining system provides a secure and readily-releasable support for an electronic assembly in a desired location, such as in a vehicle or in a stationary rack or support. The system facilitates proper alignment and positive locking of the electronic assembly without the use of tools, and may be tray-mounted or mounted at substantially any other surface. Additionally, at least a front portion of the retaining system is fully accessible to a user to facilitate installation and removal of an electronic assembly at the support.

These and other objects, advantages, purposes, and features of the present invention will become apparent upon review of the following specification in conjunction with the drawings.

DESCRIPTION OF THE PREFERRED EMBODIMENTS

Figure 1:
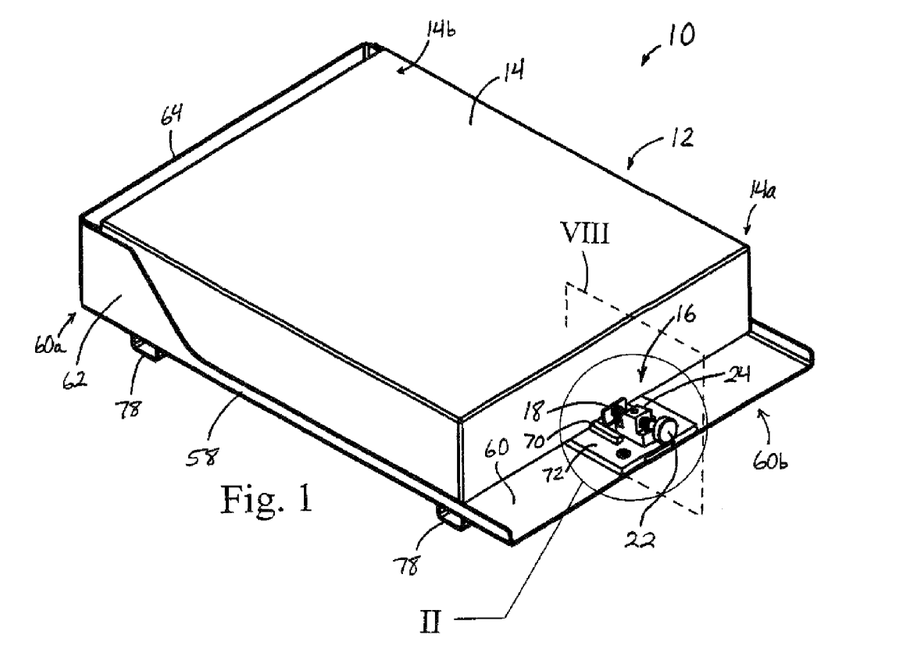
FIG. 1 is a perspective view of an electronic assembly retaining system in accordance with an embodiment of the present invention.

Referring now to the drawings and the illustrative embodiments depicted therein, an electronic assembly retaining system 10 permits releasable securement of an electronic assembly 12 that is at least partially enclosed by a housing 14 (FIG. 1). Retaining system 10 includes a front retainer assembly 16 for retaining a forward or front portion of electronic assembly 12. Front retainer assembly 16 includes a receiving element 18 at a front portion 14a of housing 14. Retaining system 10 further includes a rear retainer 20 (FIG. 4) for retaining a rearward portion of electronic assembly 12, as will be described in more detail below.

Front retainer assembly 16 includes a movable retainer stem 22 supported at a mounting member or block 24. Retainer stem 22 is positionable between a disengaging position and an engaging position to releasably lock or retain housing 14 at the front retainer assembly, as will be more fully described below. It will be understood that for purposes of this specification and the claims that follow, the terms "front" and "rear" are selected for convenience, where "front" refers generally to a more user-accessible portion of the system, and are not intended to be limiting in any way.

Figure 6:
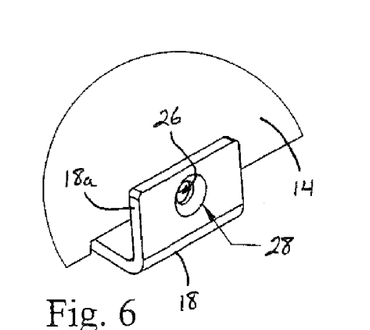
FIG. 6 is an enlarged perspective view of the area designated VI in FIG. 5.
Figure 8:
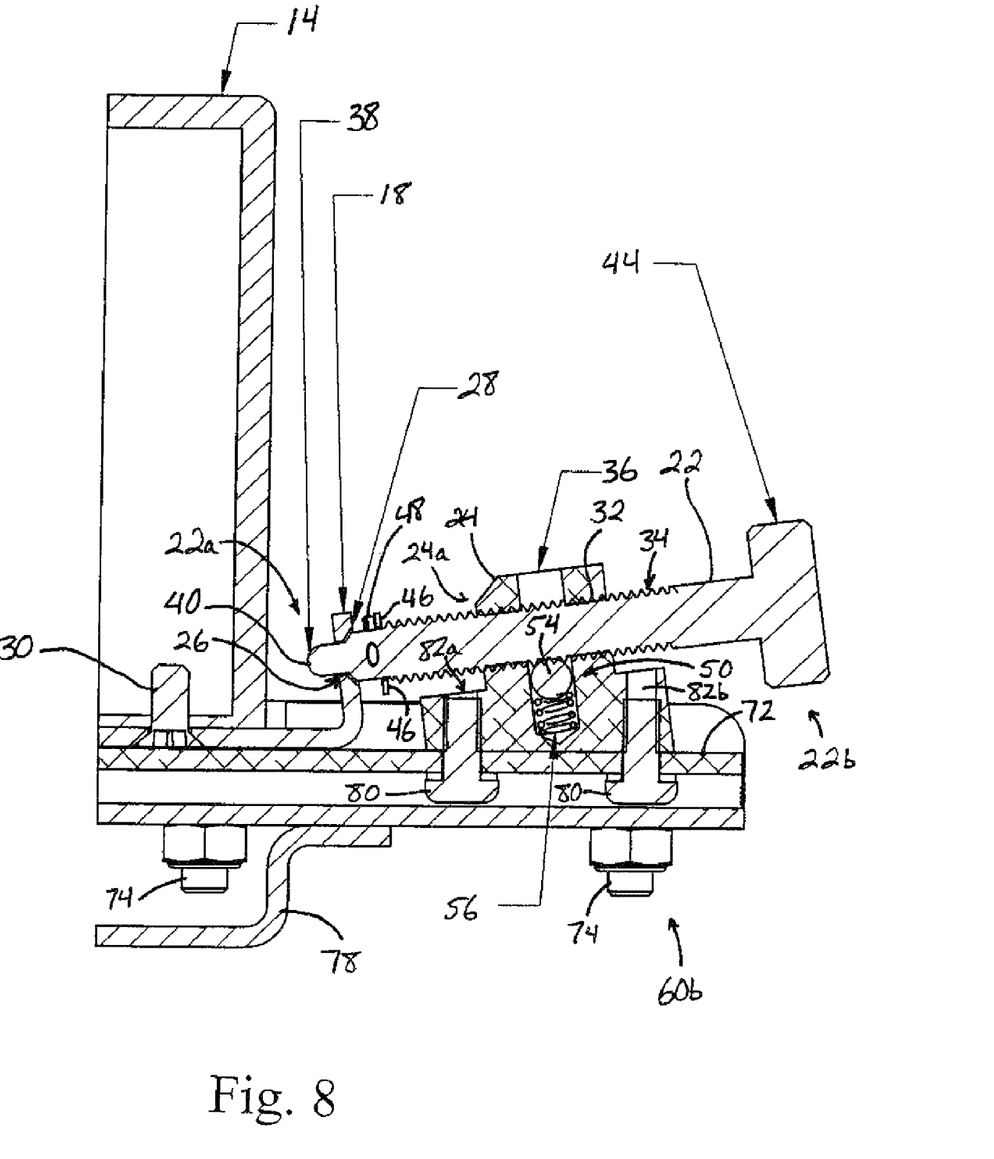
FIG. 8 is a side sectional view taken along the section designated VIII in FIG. 1.

In the illustrated embodiment, receiving element 18 is a tab that extends forwardly from a bottom edge of a front portion 14a of housing 14, and is angled upwardly to provide an upright portion 18a having an aperture or hole 26 formed therethrough (FIGS. 6 and 8). Optionally, upright portion 18a includes a countersink feature 28 surrounding aperture 26 for guiding a portion of retainer stem 22 into aperture 26, as will be more fully described. Receiving element 18 may be fastened to a lower portion of housing 14 via a fastener 30 (FIG. 8) or use substantially any other connection method, or may be integrally formed with a wall of the housing. Optionally, upright portion 18a of receiving element 18 may be capable of limited flexing, which permits a tight fit of retainer stem 22 in the aperture 26 and countersink 28 of receiving element 18, even with minor variations in the positioning of retainer stem 22 at its engaged position.

Figure 2:
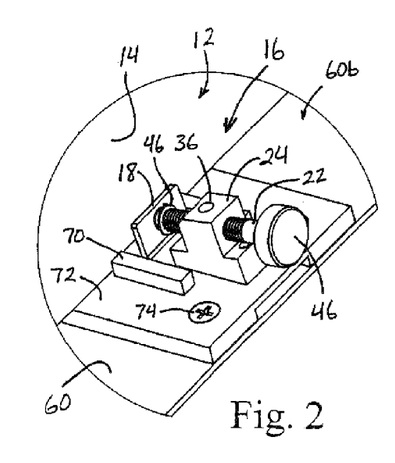
FIG. 2 is an enlarged perspective view of the area designated II in FIG. 1.

Mounting member 24 includes a threaded bore 32 (FIG. 8) for receiving and engaging a threaded portion 34 (FIGS. 3 and 8) of retainer stem 22. Threaded bore 32 is oriented so that its longitudinal axis generally aligns with aperture 26 in receiving element 18 when housing 14 is positioned at front retainer assembly 16. Threaded bore 32 may be angled with respect to the horizontal (as viewed in FIG. 8, for example) to facilitate application of a downward force component on the receiving element and housing, thereby improving retention of the electronics assembly at the retaining system. Optionally, mounting member 24 includes a transverse bore 36 (FIGS. 2 and 8) that is oriented transversely to (and intersects) threaded bore 32.

Figure 3:
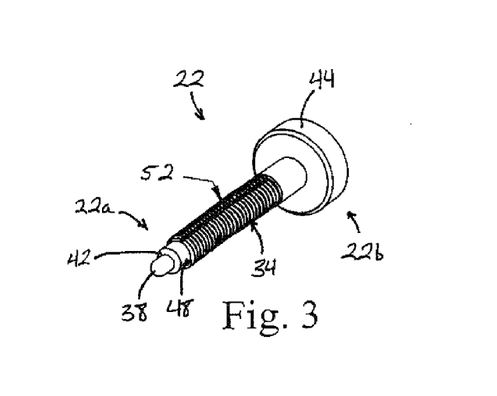
FIG. 3 is a perspective view of a retainer stem.

Located at a distal end portion 22a of retainer stem 22 is a peg portion 38 that is sized and shaped to fit into aperture 26 of receiving element 18 (FIGS. 3 and 8). Peg portion 38 includes a rounded or semi-spherical tip 40 (FIG. 8) to aid insertion of peg portion 38 into aperture 26. Also at distal end portion 22a is a beveled or conical portion 42 of stem 22, located at the aft end of peg portion 38. Conical portion 42 transitions from the relatively small diameter of peg portion 38 to a larger diameter of the stem. Located at a proximal end portion 22b of retainer stem 22 is a manual gripping portion or knob 44 that facilitates manual rotation of retainer stem 22 without the use of tools. Knob 44 may include a knurled or textured outer surface to facilitate gripping and turning. Optionally, the knob may be polygonal in shape, or may include a pair of wings (i.e. a "wing nut" shape) or other gripping surface, and/or may include a tool-receiving feature such as a slotted or crosshead or hex-socket head for receiving a screwdriver or hex wrench or the like.

Optionally, at distal end portion 22a, such as near the end of threaded portion 34 of stem 22, is an annular washer or other stop member 46 (FIGS. 2 and 8) that prevents inadvertent removal of retainer stem 22 from mounting member 24. Stop member 46 contacts the mounting member 24 at a rearward end 24a (FIG. 8) of mounting member 24 when retainer stem 22 has been drawn substantially out of mounting member 24. Stop member 46 may be held in position on retainer stem 22 between threaded portion 34 and a removable projection such as a set screw, spring pin, or roll pin 48 that is pressed into and extends radially outwardly from a hole in the distal end portion 22a of retainer stem 22.

Optionally, the receiving element at the front portion of the housing includes a receiving surface, such as a dimple or a countersink portion, without an aperture or hole. The receiving element may be a separate tab or projection, similar to element 18, or may be integrally formed at a front surface of the housing. The retainer stem may include an engaging surface at its distal end portion, such as a semi-spherical or conical or cylindrical (or other shape) tip surface. It is envisioned that the receiving surface of the receiving element and the tip surface of the retainer stem may be cooperative surfaces that are shaped to engage or contact one another when the retainer stem is moved to its engaging position, without need for an aperture in the receiving element or a peg portion of the retainer stem for insertion into the aperture. Thus, an electronics assembly may be retained at a retainer system via contact and engagement between cooperative surfaces of a receiving element and a retainer stem. Retention may be facilitated by angling the retainer stem at least somewhat downwardly (as viewed in the figures) to apply a downward force component on the receiving element and housing against another surface such as a tray, as described below.

In the illustrated embodiment, front retainer assembly 16 includes an anti-rotation feature 50 that resists rotation of stem 22 (FIG. 8). Anti-rotation feature 50 may include a detent such as one or more longitudinal grooves 52 in threaded portion 34 of retainer stem 22 (FIG. 3) and a groove-engaging member, such as a ball 54 (FIG. 8) that is inserted into transverse bore 36 and is biased against threaded portion 34 by a biasing element, such as a spring 56. Ball 54 fits partially into longitudinal groove 52 when retainer stem 22 is rotated to align the longitudinal groove with the ball. In order to further rotate retainer stem 22, an increased amount of force must be applied to knob 44 to move ball 54 out of the groove by compressing spring 56, thus creating an anti-rotation feature. Ball 54 and spring 56 thus limit or prevent inadvertent rotation of stem 22 that might otherwise be prone to occur due to vibration or shock, for example. Optionally, the retainer stem may include two or more longitudinal grooves to provide two or more detents for every full revolution of the stem. Thus, a retainer stem having two evenly-spaced grooves would have a detent for every approximately 180 degrees of rotation, a retainer stem having three evenly-spaced grooves would have a detent for every approximately 120 degrees of rotation, and so forth.

Figure 4:
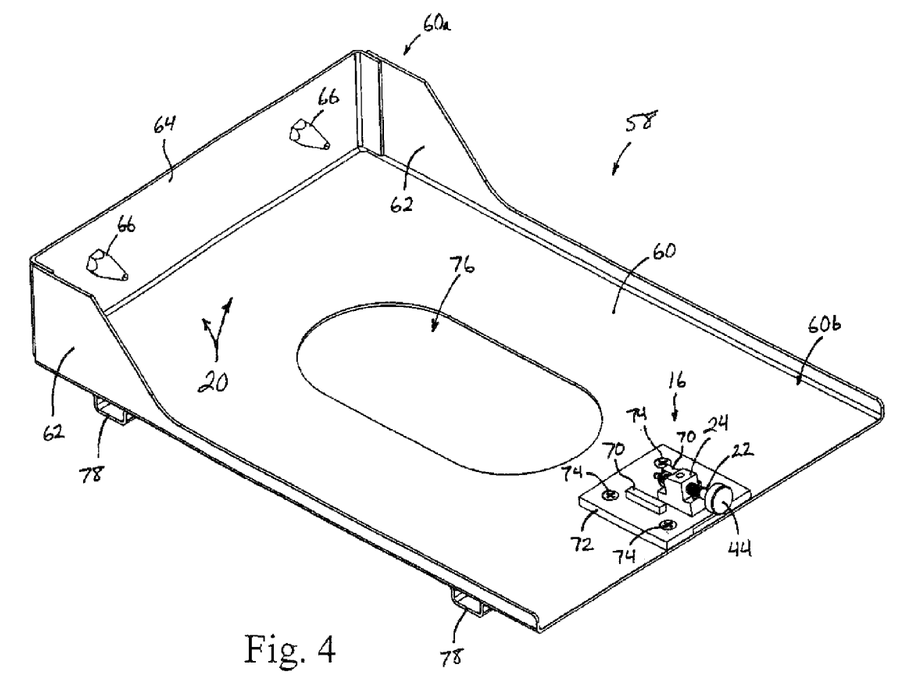
FIG. 4 is a perspective view of the retaining system with the electronic assembly housing removed.
Figure 5:
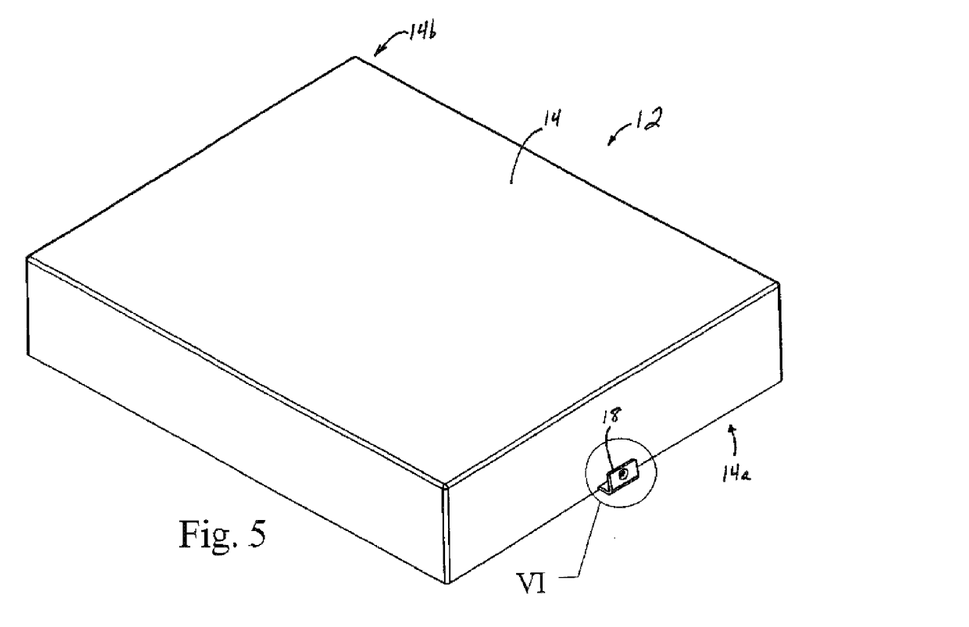
FIG. 5 is a perspective view of an electronic assembly housing.
Figure 7:
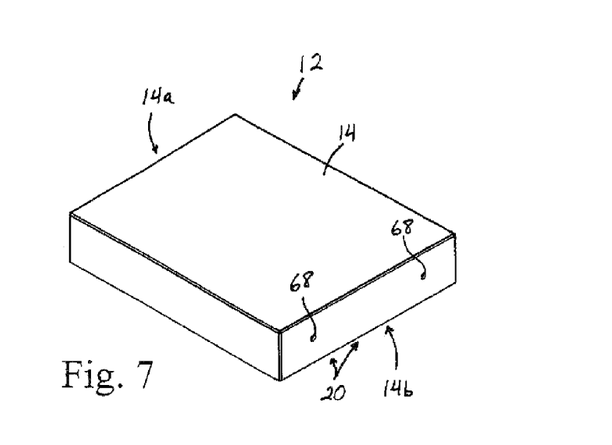
FIG. 7 is a perspective view of the electronic assembly housing of FIG. 5, showing a rear portion thereof.

Optionally, front retainer assembly 16 may be mounted to a tray 58, the tray including a bottom wall 60, a pair of partial side walls 62, and a rear wall 64 extending generally perpendicularly away from a rear portion 60a of bottom wall 60, between side walls 62 (FIG. 4). In the illustrated embodiment, rear retainer 20 includes a pair of spaced rear projections 66 on rear wall 64 that are sized and arranged to fit into apertures 68 (FIG. 7) in rear portion 14b of housing 14. Rear projections 66 may be generally conical in shape in order to facilitate and ease insertion of the projections into the apertures 68 at the rear of the housing. The spacing of rear wall 64 and rear projections 66 from mounting member 24 and retainer stem 22 is such that housing 14 fits between rear wall 64 and mounting member 24 (including retainer stem 22) for retention at tray 58. Various alternatives to rear projections 66 are envisioned such as, for example, one or more straight pegs, one or more elongate projections (such as a flat plate for engaging a slot in the housing) or slots (such as for receiving a flat projection on the housing), hook-and-loop fasteners, or substantially any feature capable of releasably engaging a rear portion of the housing.

Optionally, front retainer assembly 16 may include a pair of spaced alignment members 70 (FIGS. 1, 2, 4, and 8) near mounting member 24, which form a space for guiding and aligning receiving element 18 as front portion 14a of housing 14 is lowered into position for retention at the front retainer assembly. For example, alignment members 70 may be a pair of elongate blocks arranged on either side of mounting member 24 and spaced according to the width of receiving element 18.

Optionally, a base plate 72 may be provided for supporting mounting member 24 and/or alignment members 70 and, optionally, may be fastened to a forward portion 60*b* of bottom wall 60 of tray 58 using fasteners 74 or other attachment methods (FIGS. 1, 2, 4, and 8). When front retainer assembly 16 is installed at a tray, base plate 72 may create a gap between a bottom surface of the housing 14 and the bottom wall 60 of the tray 58 (the gap created by both the thickness of base plate 72 and by the spacing of rear projections 66 above bottom wall 60), which may facilitate air flow and cooling around the housing. Such cooling air flow may be further facilitated by an opening 76 in bottom wall 60 (FIG. 4), and by spacing created by stiffening or support members 78 (FIGS. 1, 4, and 8) fastened along a bottom surface of bottom wall 60 that permit air flow beneath tray 58. In addition to facilitating air flow, support members 78 may increase the rigidity of tray 58, and may also serve as mounting surfaces for coupling tray 58 to another surface, such as a mounting surface in a vehicle. Mounting member 24 may be fastened to base plate 72 and/or to front portion 60*b* bottom wall 60 of tray 58 (or any other mounting surface) via threaded fasteners 80 engaging threaded bores 82*a*, 82*b* in mounting member 24 (FIG. 8), or by substantially any other mounting method, such as welding, adhesives, or the like. Thus, front retainer assembly 16 is fully accessible to a user for quick coupling and decoupling of electronic assembly 12 at retaining system 10.

Figure 9:
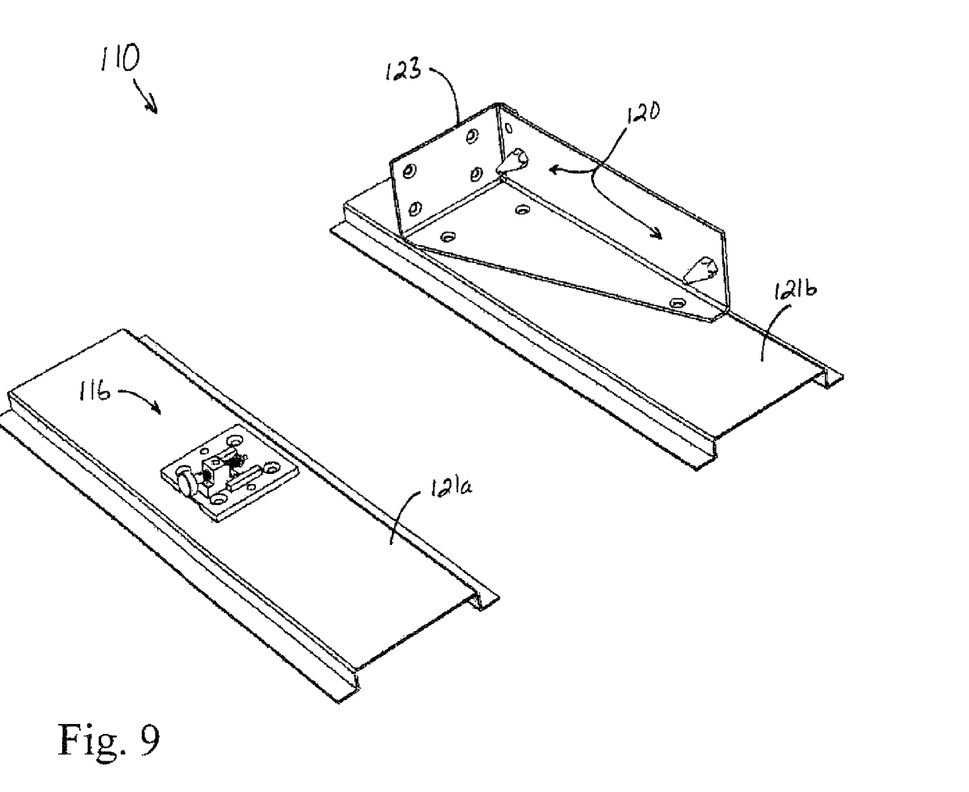
FIG. 9 is a perspective view of another electronic assembly retaining system.

Although shown and described primarily as a mounting member and retainer stem (with optional alignment members and base plate) at a front portion of a tray and spaced from a pair of conical rear projections at a rear portion of the tray, it will be appreciated that the front retainer assembly and rear retainer of the present invention may be positioned or mounted on substantially any surface or surfaces so long as the retainers are fixedly held in appropriate spaced relation to one another. For example, in the illustrated embodiment of FIG. 9, another electronic assembly retaining system 110 includes a front retainer assembly 116 and a rear retainer 120 mounted to existing structure or structural elements in an operating environment, such as stringers 121*a*, 121*b* in an aircraft structure. Front retainer assembly 116 and rear retainer 120 are substantially identical to front retainer assembly 16 and rear retainer 20, described above, such that their details and function need not be repeated. Rear retainer 120 includes a mounting structure 123 that supports a pair of rear projections 166 having the same configuration and function as rear projections 66, described above. Front retainer assembly 116 is mounted to the forward stringer 121*a* and rear retainer 120 is mounted to the aft stringer, without any direct connection between the front and rear retainers. However, it will be appreciated that stringers 121*a*, 121*b* are held in substantially fixed relation to one another, such as by other aircraft structure (not shown) to which the stringers are mounted. Thus, embodiments of the present invention are not limited to applications in which rear projections (or other engaging members), a mounting member, and a retainer stem are mounted to a single tray or mounting surface.

Accordingly, electronic assembly retaining system 10 provides a secure but readily-releasable means for supporting an electronic assembly in a desired location, such as in a vehicle (e.g., an automobile, aircraft, watercraft, spacecraft, etc.), and which facilitates proper alignment and positive locking without the use of tools. In order to releasably mount an electronic assembly, such as an avionics assembly (e.g. a Line Replaceable Unit or "LRU") enclosed in housing 14, the housing is positioned with its rear portion 14*b* and apertures 68 aligned with rear projections 66. Housing 14 is then moved rearwardly to engage rear projections 66 in apertures 68 of rear portion 14*b*. Front portion 14*a* is then lowered (such as in a pivotal motion about rear projections 66) until upright portion 18*a* of receiving element 18 is substantially aligned with retainer stem 22. When properly aligned, receiving element 18 is positioned between alignment members 70 on base plate 72, if provided. Retainer stem 22 is then rotated via knob 44, causing the retainer stem to translate axially toward receiving element 18. Where retainer stem 22 includes longitudinal groove 52 along threaded portion 34, and mounting member 24 includes a groove-engaging member (ball 54) and a biasing element (spring 56), rotation of retainer stem 22 requires repeatedly overcoming a detent, or increased resistance to rotation, at least once per revolution of the retainer stem.

Minor alignment adjustments are automatically made by the front retainer assembly if rounded tip 40 of retainer stem 22 is misaligned with aperture 26 in receiving element 18 so that rounded tip 40 initially contacts countersink 28 of receiving element 18. When such a misalignment occurs, further turning of retainer stem 22 causes rounded tip 40 to push against the ramped surface of countersink 28, which causes receiving element 18 and the entirety of housing 14 (particularly the front portion 14*a* of housing 14) to move so as to align aperture 26 with peg portion 38, whereby the peg portion ultimately enters and substantially passes into and through aperture 26. With peg portion 38 of retainer stem 22 inserted into aperture 26, the peg portion prevents both vertical and lateral movement of at least the front portion 14*a* of the housing 14.

When distal end portion 22*a* of retainer stem 22 is fully seated at receiving element 18, conical portion 42 of retainer stem 22 is seated against countersink 28 of receiving element 18. Thus, conical portion 42 provides a surface that is forced against a portion of receiving element 18 (i.e. countersink 28) when retainer stem 22 is extended to apply a retention force against the housing 14. With retainer stem 22 in its fully engaged position, rear portion 14*b* of housing 14 is fixedly held by rear projections 66, while front portion 14*a* of housing 14 is fixedly held by peg portion 38 of retainer stem 22 positioned in aperture 26 of receiving element 18. Further, retainer stem 22 is substantially prevented from inadvertently backing away from its engaged position by the detent(s) provided by the ball 54 being urged into contact with one or more longitudinal grooves 52 in the threaded portion 34 of stem 22.

To remove the electronic assembly (enclosed by housing 14) from the retaining system, the retainer stem 22 is grasped at its knob 44 and is rotated in an opposite direction at least until peg portion 38 is fully removed from aperture 26 in receiving element 18. Once peg portion 38 has disengaged, front portion 14*a* of housing 14 may be lifted (such as in a pivotal motion about rear projections 66) and once front portion 14*a* is clear of obstructions, housing 14 may be further pulled or moved to disengage rear projections 66 from apertures 68 in rear portion 14*b* of housing 14. Subsequently, another housing having a receiving element at a front portion and apertures at a rear portion may be readily positioned at the same retaining system and installed in the manner described above, and without the use of tools. Retainer stem 22 is substantially prevented from inadvertent rotation in mounting member 24 by longitudinal groove 52 and ball 54, and may be prevented from unintentional removal by stop member 46 and roll pin 48 at distal end portion 22*a* of retainer stem 22.

Although shown and described herein as having a threaded stem supported in a mounting member, whereby rotation of the stem causes it to translate axially along the mounting member, it will be appreciated that alternative configurations are envisioned for positioning a peg or a stem from a retainer assembly into the aperture of a receiving member on a housing. For example, a pin or stem or other projection may be extended between a locked-engaging position and an unlocked-disengaging position by a twist-lock device (including a spring-loaded twist-lock device); a cam-lock device (including a spring-loaded cam-lock device, such as is commonly used on retractable pens); a powered actuator (such as a mechanical or electromechanical, pneumatic, or hydraulic actuator or the like); a pivot mechanism; or substantially any other device or mechanism that can be used to translate and releasably lock a projection in place.

Thus, the electronic assembly retaining system of the present invention provides a lightweight and secure means for supporting an electronic assembly, such as an LRU, which is lockable and releasable such as by manual turning or manipulation of a single knob or retainer stem or projection, without the use of tools, and which aids and ensures proper alignment of the electronic assembly for reliable and secure retention, without substantial risk of loosening or release. In addition, the electronic assembly is quickly removable and replaceable by turning a single knob at the front of the retaining system, in a readily accessible location, and without the use of tools.

Changes and modifications in the specifically described embodiments may be carried out without departing from the principles of the present invention, which is intended to be limited only by the scope of the appended claims, as interpreted according to the principles of patent law including the doctrine of equivalents.

We claim:

1. An electronic assembly retaining system for releasably retaining an electronic assembly, said retaining system comprising:
   a housing for housing at least a portion of an electronic assembly, said housing having a front portion and a rear portion;
   a front retainer assembly comprising a mounting member, a retainer stem movably mounted to said mounting member, and a receiving element at said front portion of said housing, said receiving element and said retainer stem comprising cooperative surfaces, said retainer stem being movable along said mounting member between an engaging position in which said cooperative surfaces contact one another and a disengaging position in which said cooperative surfaces are spaced from one another, wherein said retainer stem remains attached to said mounting member in said engaging and disengaging positions;
   a rear retainer adapted to engage said rear portion of said housing; and
   wherein said housing is retained by said front retainer assembly when said retainer stem is moved to said engaging position, and wherein said housing is removable from said mounting member of said front retainer assembly when said retainer stem is moved to said disengaging position, said retainer stem remaining with said mounting member upon removal of said housing.

2. The retaining system of claim 1, further comprising a tray having a bottom wall and a rear wall extending away from said bottom wall at a rear portion thereof, said mounting member and said retainer stem mounted at a front portion of said tray.

3. The retaining system of claim 1, wherein said front retainer assembly and said rear retainer are mounted to existing structure in an operating environment.

4. The retaining system of claim 1, comprising a stem-moving feature adapted to move said retainer stem between said engaging position and said disengaging position.

5. The retaining system of claim 4, wherein said stem-moving feature comprises a threaded bore in said mounting member and a threaded shaft of said retainer stem, whereby said retainer stem is axially repositionable by rotating said retainer stem in said threaded bore.

6. The retaining system of claim 5, wherein said retaining stem comprises a knob at a proximal end portion, said knob being adapted to facilitate manual rotation of said retaining stem without the use of tools.

7. The retaining system of claim 1, wherein said housing comprises said receiving element.

8. The retaining system of claim 1, wherein said rear retainer comprises:
   a rear portion of said housing having a rear surface, said rear surface defining an aperture;
   a rear projection on said rear retainer, said rear projection adapted to engage said aperture at said rear surface of said housing; and
   wherein said rear portion of said housing is retained at said rear retainer by engagement of said aperture on said rear surface of said housing with said rear projection when said receiving element of said housing is engaged by said retainer stem.

9. An electronic assembly retaining system for releasably retaining an electronic assembly, said retaining system comprising:
   a housing for housing at least a portion of an electronic assembly, said housing having a front portion and a rear portion;
   a front retainer assembly comprising a mounting member, a retainer stem movably mounted to said mounting member, and a receiving element at said front portion of said housing, said receiving element and said retainer stem comprising cooperative surfaces, said retainer stem being movable between an engaging position in which said cooperative surfaces contact one another and a disengaging position in which said cooperative surfaces are spaced from one another;
   a stem-moving feature adapted to move said retainer stem between said engaging position and said disengaging position, said stem-moving feature including a threaded bore in said mounting member and a threaded shaft of said retainer stem, whereby said retainer stem is axially repositionable by rotating said retainer stem in said threaded bore;
   a longitudinal groove along said threaded shaft of said retainer stem;
   a groove-engaging member being positionable against said threaded shaft when said threaded shaft is positioned in said threaded bore;
   a biasing element adapted to urge said groove-engaging member against said threaded shaft so that said groove-engaging member engages said threaded shaft and alternately engages and disengages said longitudinal groove as said retainer stem is rotated, and engagement of said groove-engaging member with said longitudinal groove creates a resistance to rotation of said retainer stem to limit inadvertent rotation of said retainer stem;
   a rear retainer adapted to engage said rear portion of said housing; and wherein said housing is retained by said front retainer assembly when said retainer stem is moved to said engaging position, and wherein said housing is removable from said mounting member of said front retainer assembly when said retainer stem is moved to said disengaging position.

10. The retainer system of claim 9, further comprising a transverse bore in said mounting member, said transverse bore aligned transversely to said threaded bore and intersecting said threaded bore, and said groove-engaging member and said biasing element being positioned in said transverse bore.

11. The retaining system of claim 9, wherein said biasing element comprises a spring and said groove-engaging member comprises a ball.

12. An electronic assembly retaining system for releasably retaining an electronic assembly, said retaining system comprising:
  a housing for housing at least a portion of an electronic assembly, said housing having a front portion and a rear portion;
  a front retainer assembly comprising a mounting member, a retainer stem movably mounted to said mounting member, and a receiving element at said front portion of said housing, said receiving element and said retainer stem comprising cooperative surfaces, said retainer stem being movable between an engaging position in which said cooperative surfaces contact one another and a disengaging position in which said cooperative surfaces are spaced from one another.
  said retainer stem having a distal end comprising a peg portion and said receiving element having an aperture, said peg portion adapted to engage said aperture of said receiving element with said retainer stem in said engaging position;
  a rear retainer adapted to engage said rear portion of said housing; and
  wherein said housing is retained by said front retainer assembly when said retainer stem is moved to said engaging position, and wherein said housing is removable from said mounting member of said front retainer assembly when said retainer stem is moved to said disengaging position.

13. The retaining system of claim 12, wherein said retainer stem comprises a conical portion adjacent said peg portion, said conical portion adapted to engage a corresponding countersink at said aperture of said receiving element when said retainer stem is in said engaging position.

14. The retaining system of claim 13, wherein said peg portion of said retainer stem is adapted to align said receiving element and the housing at said front retainer assembly when said peg portion engages said countersink of said receiving element as said peg portion is moved toward said engaging position.

15. An electronic assembly retaining system for releasably retaining an electronic assembly, said retaining system comprising:
  a housing for housing at least a portion of an electronic assembly, said housing having a front portion and a rear portion;
  a front retainer assembly comprising a mounting member, a retainer stem movably mounted to said mounting member, and a receiving element at said front portion of said housing, said receiving element and said retainer stem comprising cooperative surfaces, said retainer stem being movable between an engaging position in which said cooperative surfaces contact one another and a disengaging position in which said cooperative surfaces are spaced from one another;
  said retainer stem comprising a distal end comprising a conical portion and said receiving element comprising a countersink, wherein said conical portion of said retainer stem is adapted to engage said countersink of said receiving element when said retainer stem is in said engaging position;
  a rear retainer adapted to engage said rear portion of said housing; and
  wherein said housing is retained by said front retainer assembly when said retainer stem is moved to said engaging position, and wherein said housing is removable from said mounting member of said front retainer assembly when said retainer stem is moved to said disengaging position.

16. The retaining system of claim 15, wherein said conical portion of said retainer stem is adapted to align said receiving element and the housing at said front retainer assembly when said conical portion engages said countersink of said receiving element as said retainer stem is moved toward said engaging position.

17. An electronic assembly retaining system for releasably retaining an electronic assembly, said retaining system comprising:
  a housing for housing at least a portion of an electronic assembly, said housing having a front portion and a rear portion;
  a front retainer assembly comprising a mounting member, a retainer stem movably mounted to said mounting member, and a receiving element at said front portion of said housing, said receiving element and said retainer stem comprising cooperative surfaces, said retainer stem being movable between an engaging position in which said cooperative surfaces contact one another and a disengaging position in which said cooperative surfaces are spaced from one another;
  a rear retainer adapted to engage said rear portion of said housing;
  wherein said housing is retained by said front retainer assembly when said retainer stem is moved to said engaging position, and wherein said housing is removable from said mounting member of said front retainer assembly when said retainer stem is moved to said disengaging position; and
  wherein said front retainer assembly further comprises a pair of laterally-spaced alignment members positioned adjacent said receiving element of said housing when the electronic assembly is positioned at said retaining system, said projections defining a space therebetween and adapted to receive said receiving element of said housing in said space when said housing is positioned at said retaining system.

18. The retaining system of claim 17, wherein said front retainer assembly further comprises a retainer base plate, said alignment members and said mounting member coupled to said base plate, wherein said housing is coupled to said base plate via said retainer stem positioned in said receiving element.

19. The retaining system of claim 18, further comprising a tray having a bottom wall and a rear wall extending away from said bottom wall at a rear portion thereof, said mounting member and said retainer stem mounted at a front portion of said tray, and wherein said housing is spaced above said bottom wall of said tray by said base plate.

20. An electronic assembly retaining system for releasably retaining an electronic assembly, said retaining system comprising:
- a tray having a bottom wall and a rear wall extending away from said bottom wall at a rear portion thereof, said tray adapted to receive a housing of an electronic assembly, said housing including a front portion and a rear portion;
- a front retainer assembly comprising a mounting member, a retainer stem movably mounted to said mounting member, and a receiving element at said front portion of said housing, said receiving element including an aperture and a countersink portion around said aperture;
- said mounting member being positioned at said bottom wall of said tray, opposite said rear wall, and having a threaded bore;
- said retainer stem being movable in said threaded bore between an engaging position and a disengaging position;
- said retainer stem comprising threaded shaft, a knob, and a peg portion at a distal end, said peg portion adapted to engage said aperture of said receiving element;
- a rear retainer adapted to engage said rear portion of said housing, said rear retainer comprising a rear projection at said rear wall of said tray and an aperture in said rear portion of said housing for receiving said rear projection; and
- wherein said housing is retained at said tray when said peg portion of said retainer stem is moved into said aperture of said receiving element and said rear projection is received at said aperture in said rear portion of said housing, and wherein said housing is removable from said tray when said peg portion of said retainer stem is moved out of said aperture of said receiving element.

21. The retaining system of claim 20, wherein said retainer stem comprises a conical portion adjacent said peg portion, said conical portion adapted to engage said countersink portion at said aperture of said receiving element when said retainer stem is in said engaging position.

22. The retaining system of claim 21, wherein said peg portion of said retainer stem is adapted to align said receiving element and said housing on said tray when said peg portion engages said countersink of said receiving element as said peg portion is moved toward said engaging position.

23. The retaining system of claim 22, further comprising:
- a longitudinal groove along said threaded shaft of said retainer stem;
- a transverse bore in said mounting member, said transverse bore aligned transversely to and intersecting said threaded bore;
- a groove-engaging member in said transverse bore, said groove-engaging member being positionable against said threaded shaft when said threaded shaft is positioned in said threaded bore;
- a biasing element in said transverse bore, said biasing element adapted to urge said groove-engaging member against said threaded shaft;
- wherein said groove-engaging member engages said threaded shaft and alternately engages and disengages said longitudinal groove as said retainer stem is rotated; and
- wherein engagement of said groove-engaging member with said longitudinal groove creates a detent or resistance to rotation of said retainer stem whereby inadvertent rotation of said retainer stem is limited.

24. The retaining system of claim 20, further comprising a pair of laterally-spaced alignment members at said front portion of said bottom wall of said tray, said projections defining a space therebetween and adapted to receive said receiving element of said housing in said space when said housing is positioned at said tray.

25. The retaining system of claim 24, further comprising a retainer base plate at said front portion of said bottom wall of said tray, said base plate coupled to said bottom wall, and said alignment members and said mounting member coupled to said base plate, wherein said housing is coupled to said base plate via said retainer stem in said receiving element and said housing is spaced above said bottom wall of said tray by said base plate.

26. A method of retaining an electronic assembly at a mounting tray, said method comprising:
- providing a tray having a bottom wall and a rear wall extending away from the bottom wall, the rear wall including a projection extending forwardly therefrom;
- providing a front retainer assembly including a mounting member and a retainer stem at the mounting member, the retainer stem being movable between an engaging position and a disengaging position while remaining attached to the mounting member;
- providing a rear retainer including a projection spaced from the front retainer assembly;
- positioning a housing for an electronic assembly so as to engage an aperture in a rear surface of the housing with the projection of the rear retainer;
- further positioning the housing so as to align a receiving element at a front portion of the housing with the retainer stem at the mounting member, the housing being positioned between the mounting member and the projection;
- moving the retainer stem along the mounting member so as to engage a distal end portion of the retainer stem with a receiving surface of the receiving element of the housing.

* * * * *